(12) United States Patent
Embertson et al.

(10) Patent No.: US 9,536,764 B2
(45) Date of Patent: Jan. 3, 2017

(54) END EFFECTOR FOR WAFER TRANSFER SYSTEM AND METHOD OF TRANSFERRING WAFERS

(71) Applicant: Lam Research Corporation, Fremont, CA (US)

(72) Inventors: Ross Embertson, Half Moon Bay, CA (US); Brandon Senn, Molalla, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 65 days.

(21) Appl. No.: 14/606,664

(22) Filed: Jan. 27, 2015

(65) Prior Publication Data

US 2016/0218030 A1    Jul. 28, 2016

(51) Int. Cl.
*H01L 21/677* (2006.01)
*B25J 15/00* (2006.01)
*B25J 11/00* (2006.01)
*B25J 15/08* (2006.01)

(52) U.S. Cl.
CPC ...... *H01L 21/67742* (2013.01); *B25J 11/0095* (2013.01); *B25J 15/0028* (2013.01); *B25J 15/086* (2013.01)

(58) Field of Classification Search
USPC ...................................... 294/119.1, 207, 213
See application file for complete search history.

(56) References Cited

U.S. PATENT DOCUMENTS

| | | | |
|---|---|---|---|
| 4,735,452 A | 4/1988 | Nemoto | |
| 5,022,695 A | 6/1991 | Ayers | |
| 5,700,046 A | 12/1997 | Van Doren et al. | |
| 5,955,858 A | 9/1999 | Kroeker et al. | |
| 6,100,677 A | 8/2000 | Farrenkopf | |
| 6,155,773 A | 12/2000 | Ebbing et al. | |
| 6,167,322 A | 12/2000 | Holbrooks | |
| 6,283,701 B1 | 9/2001 | Sundar et al. | |
| 6,305,898 B1 | 10/2001 | Yamagishi et al. | |
| 6,322,119 B1 | 11/2001 | Schmidt et al. | |
| 6,322,312 B1 | 11/2001 | Sundar | |
| 6,491,330 B1 | 12/2002 | Mankame et al. | |

(Continued)

OTHER PUBLICATIONS

"NSK Miniature Linear Guides: Miniature PU Series/PE Series", NSK, Cat. No. E3327c, 2013, pp. 1-12.
http://www.quadrantplastics.com/na-en/products/machinable-plastics/advanced-325-425-f/semitron-R-semiconductor-grade-products.html.

*Primary Examiner* — Scott Lowe
*Assistant Examiner* — Ronald Jarrett (57) ABSTRACT

An end effector of a wafer transfer system includes synchronously movable blades operable to hold and release wafers. The end effector comprises an end effector housing including a first blade mount coupled to a first blade, a second blade mount coupled to a second blade, and an actuator operable to move the blade mounts on respective linear rails. The actuator includes a longitudinally movable piston coupled to the respective blade mounts by respective actuator links. The actuator links are pivotally coupled to the longitudinally movable piston at respective first ends thereof and to the first and second blade mounts at respective second ends thereof wherein moving the piston towards a retracted position causes the blades to synchronously move laterally towards each other and moving the piston towards the retracted position causes the blades to synchronously move laterally away from each other so as to hold or release a wafer.

20 Claims, 5 Drawing Sheets

(56) References Cited

U.S. PATENT DOCUMENTS

| | | | |
|---|---|---|---|
| 6,572,320 B2 * | 6/2003 | Davis | H01L 21/67754 |
| | | | 294/119.1 |
| 6,682,113 B2 | 1/2004 | Cox et al. | |
| 7,140,655 B2 | 11/2006 | Kesil et al. | |
| 7,281,741 B2 | 10/2007 | Woodruff et al. | |
| 7,300,082 B2 | 11/2007 | Rogers et al. | |
| 7,334,826 B2 | 2/2008 | Woodruff et al. | |
| 7,516,833 B2 | 4/2009 | Todaka | |
| 7,641,247 B2 | 1/2010 | Blonigan et al. | |
| 8,622,451 B2 | 1/2014 | Mantz | |
| 8,681,434 B2 | 3/2014 | Chou | |
| 8,791,614 B2 | 7/2014 | Obweger et al. | |
| 8,833,380 B2 | 9/2014 | Obweger et al. | |
| 8,845,262 B2 | 9/2014 | Murata et al. | |
| 2003/0035711 A1 * | 2/2003 | Gilchrist | H01L 21/68707 |
| | | | 414/744.5 |
| 2011/0236162 A1 * | 9/2011 | Shikayama | H01L 21/68742 |
| | | | 414/222.01 |
| 2013/0101372 A1 | 4/2013 | Tschinderle et al. | |
| 2013/0309048 A1 | 11/2013 | Gleissner | |
| 2014/0017042 A1 | 1/2014 | Rodnick et al. | |
| 2014/0154033 A1 | 6/2014 | Blank et al. | |

* cited by examiner

END EFFECTOR FOR WAFER TRANSFER SYSTEM AND METHOD OF TRANSFERRING WAFERS

FIELD OF THE INVENTION

Embodiments disclosed herein pertain to semiconductor wafer processing equipment, and more particularly to end effectors of robot arms of wafer transferring systems of semiconductor wafer processing equipment operable to pick up, transfer, and place the wafers such that the wafers may be transferred between modules of the semiconductor wafer processing equipment.

BACKGROUND

Different types of tools are used to perform hundreds of processing operations during processing of wafers (i.e. semiconductor substrates) in wafer processing systems. Most of these operations are performed in vacuum chambers (i.e., process chambers) of a wafer processing system at very low pressure. Other operations are performed at atmospheric pressure in controlled environments of filtered air or an inert gas. Wafers are introduced to the process chambers with wafer transfer systems (i.e. wafer handling systems) that are mechanically coupled to respective process chambers such that a wafer transferred to the process chamber may be processed in the process chamber. Wafer transfer systems can include, for example, equipment front end modules (EFEMs) which are operable to transfer wafers from a front opening unified pod (FOUP) to the wafer processing system for processing and back to the FOUP, load locks to bring the wafers from atmospheric conditions to very low pressure conditions (e.g., vacuum conditions) and back to atmospheric conditions wherein robots transfer the wafers to various positions in the wafer processing system. Throughput (i.e., the number of wafers that are processed in a period of time) is affected by the wafer processing time as well as wafer transferring time.

When transferring semiconductor wafers via a robotic arm end effector, ensuring that the wafer is properly located on the end effector when first picked up, and also ensuring that the wafer does not slip or shift during the transfer and subsequent placement of the wafer on a support surface is required such that the wafer will not be damaged or misaligned during the transfer of the wafer. Additionally, repeated proper placement of wafers on a support surface of a processing module increases wafer processing throughput by eliminating the need to readjust a wafer which has not been properly placed on a support surface of a wafer processing module or improperly held by an end effector. Thus, there is a need for end effectors which can properly locate a wafer thereon when the end effector picks up a wafer, and end effectors which can properly place a wafer on a support surface such that the placed wafer does not need to be readjusted.

SUMMARY

Disclosed herein is an end effector of a robot arm of a wafer transfer system operable to hold and release individual wafers such that the robot arm may transfer a held wafer from first to second positions in semiconductor wafer processing equipment. The end effector comprises an end effector housing that includes a first blade mount coupled to a first blade, a second blade mount coupled to a second blade, at least one first mount linear rail, at least one second mount linear rail, and an actuator. The first blade mount is laterally movable on the at least one first mount linear rail and the second blade mount is laterally movable on the at least one second mount linear rail such that the actuator included in the housing may synchronously move the first and second blades laterally towards each other and laterally away from each other such that the first and second blades may hold and release an individual wafer.

The actuator includes a longitudinally movable piston which is coupled to the first blade mount by a first actuator link and to the second blade mount by a second actuator link wherein the longitudinally movable piston is operable to move between a protracted position and a retracted position. The first actuator link is pivotally coupled to the longitudinally movable piston at a first end thereof by a first link pivot and the first actuator link is pivotally coupled to the first blade mount at a second end thereof by a first mount pivot. The second actuator link is pivotally coupled to the longitudinally movable piston at a first end thereof by a second link pivot and the second actuator link is pivotally coupled to the second blade mount at a second end thereof by a second mount pivot.

The first blade mount includes a first actuator link recess such that the first actuator link may rotate therein between an upper surface of the first blade mount and a lower surface of a back end of the first blade when the longitudinally movable piston is longitudinally moved. The second blade mount includes a second actuator link recess such that the second actuator link my rotate therein between an upper surface of the second blade mount and a lower surface of a back end of the second blade when the longitudinally movable piston is longitudinally moved. Moving the longitudinally movable piston towards the protracted position causes the first and second blades to synchronously move laterally towards each other and moving the longitudinally movable piston towards the retracted position causes the first and second blades to synchronously move laterally away from each other.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

An end effector is a device or tool that is connected to the end of a robot arm of a wafer transfer system. Wafer transfer systems can include, for example, an equipment front end module (EFEM), a vacuum wafer transfer module, or an atmospheric wafer transfer module. The end effector is the part of the robot that is operable to support a wafer while the wafer is transferred by the robot. Preferably the end effector is rotatably attached to the end of a robot arm.

In semiconductor manufacturing, some end effectors are employed to transfer semiconductor wafers between different locations or modules of the semiconductor processing equipment, such as transferring wafers from an alignment station to an etching station, or between a wafer storage location and a wafer processing module of a wafer processing system.

Figure 1:
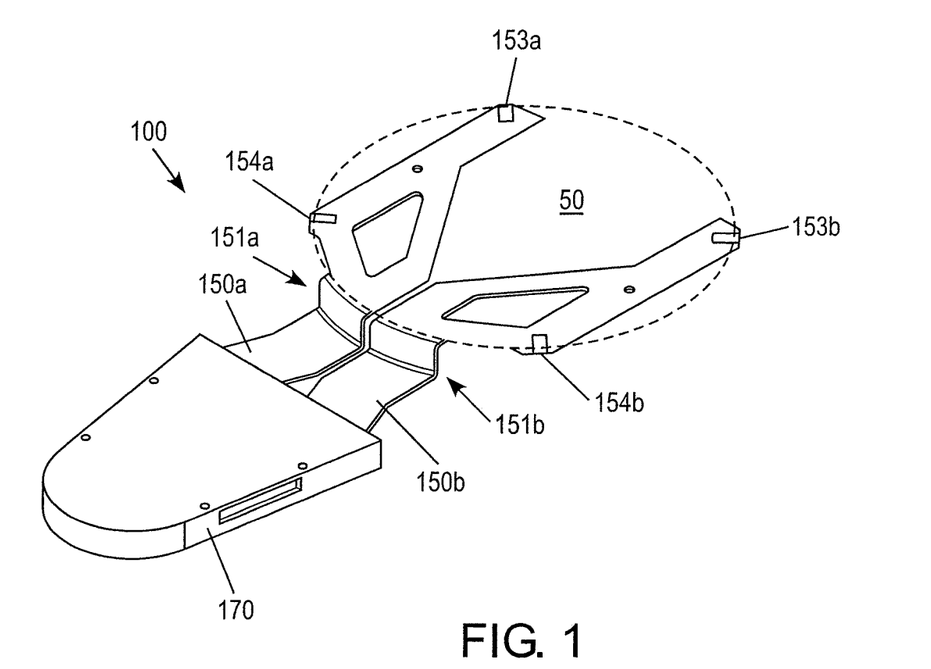
FIG. 1 shows an end effector in accordance with an embodiment as disclosed herein.

FIG. 1 illustrates an embodiment of an end effector 100 of a robot arm of a wafer transfer system that can properly locate a wafer 50 thereon when the end effector 100 holds the wafer 50, wherein the end effector 100 can repeatedly properly align the wafer 50 with respect to the end effector 100, and thereby a wafer support to which the wafer 50 is transferred, such that a wafer 50 may be supported by the wafer support and does not need to be readjusted after the wafer has been transferred to the wafer support and released by the end effector 100. The end effector 100 is preferably rotatably mounted on the end of a robot arm of a wafer transfer system which is operable to transfer the wafer 50 at an end effector arm mount 171 (see FIG. 4). An exemplary embodiment of a robot arm which can include embodiments of end effectors disclosed herein mounted thereon may be found in commonly assigned U.S. Patent Application Publication 2014/0154033 which is hereby incorporated herein in its entirety.

The end effector 100 includes a housing 170, preferably formed of aluminum, wherein a first blade 150a and a second blade 150b extend from the housing 170 and are operable to support a wafer 50 thereon. An actuator (not shown) in the housing 170 is operable to synchronously move the first and second blades 150a, 150b laterally towards each other and laterally away from each other such that an individual wafer 50 may be releasably held by the first and second blades 150a, 150b of the end effector 100. In an embodiment, the first blade 150a may include a first blade step 151a along a length thereof and the second blade 150b may include a second blade step 151b along a length thereof. The first blade 150a preferably includes a first blade front wafer pad 153a and a first blade back wafer pad 154a outward of the step 151a, and the second blade 150b preferably includes a second blade front wafer pad 153b and a second blade back wafer pad 154b outward of the step 151b wherein the front and back wafer pads 153a,b and 154a,b of the respective first blade 150a and second blade 150b are shaped to support, hold (grip), and properly align an individual wafer 50 thereon such that the wafer 50 does not contact the first blade 150a or the second blade 150b.

Figure 2:
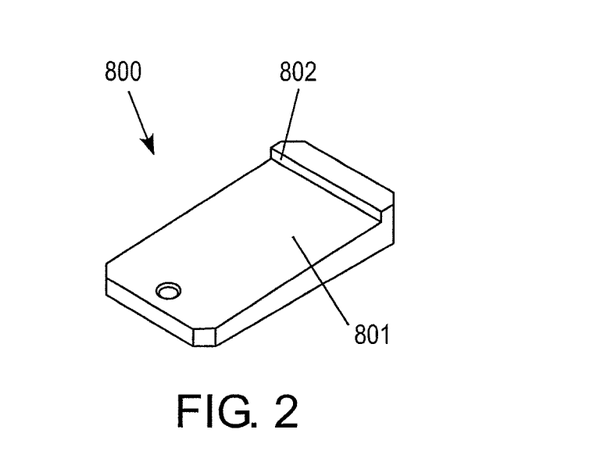
FIG. 2 shows a wafer pad of an end effector in accordance with an embodiment as disclosed herein.

FIG. 2 shows a wafer pad 800 which may be used as a front or back wafer pad of the first blade 150a or the second blade 150b. The wafer pads 800 are preferably made of polyether ether ketone (PEEK) wherein each wafer pad 800 preferably includes a support surface 801 and a gripping surface 802 wherein the gripping surfaces 802 of the front and back wafer pads of the first blade 150a and the front and back wafer pads of the second blade 150b are adapted to automatically center (align) the wafer 50 over the first and second blades 150a, 150b of the end effector 100 when the wafer 50 is held by the end effector 100. In a preferred embodiment, the support surface 801 is a ramped surface and the gripping surface 802 is a vertical or inclined surface wherein the ramped support surface 801 is ramped upwardly toward the gripping surface 802.

Figure 3:
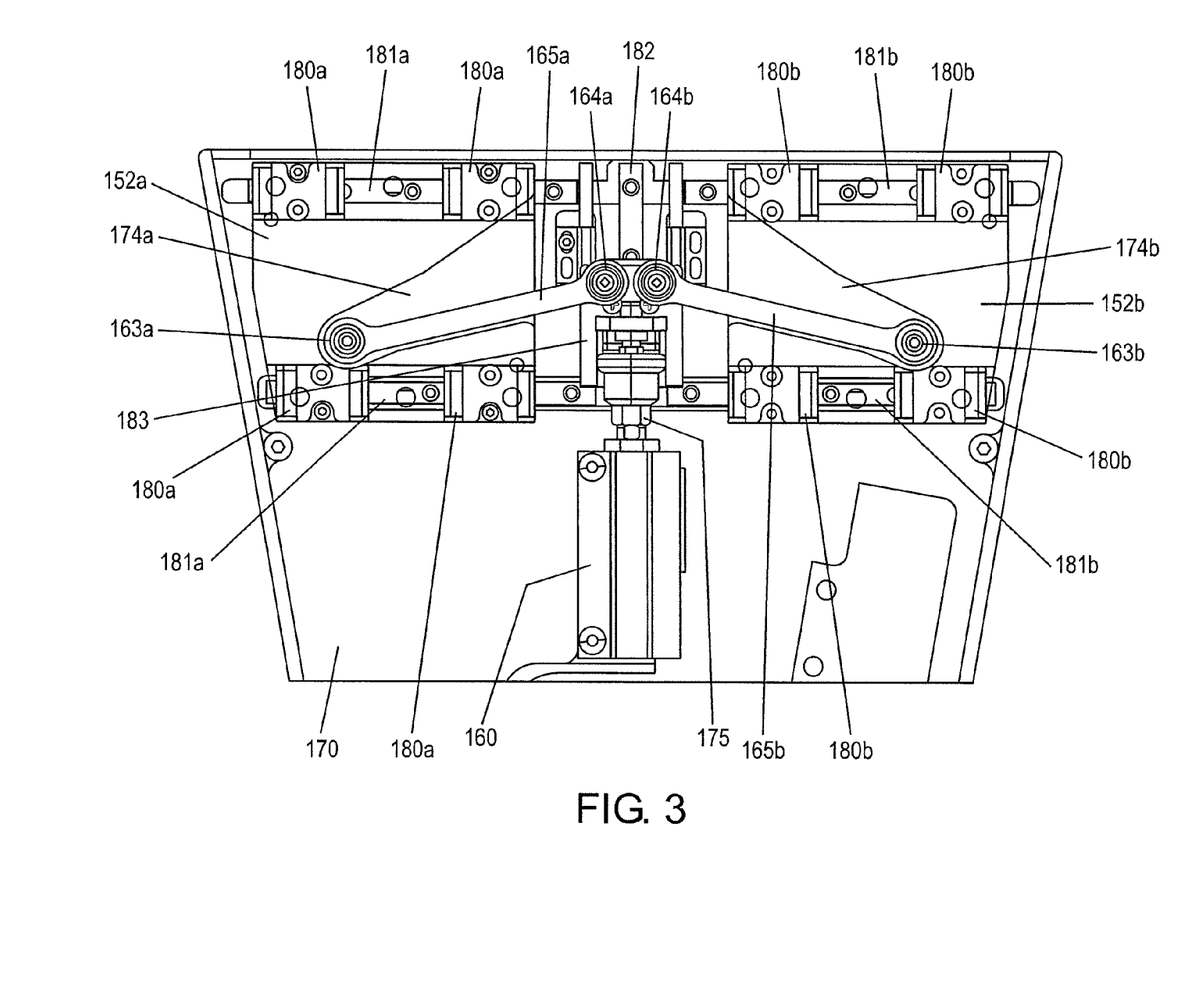
FIG. 3 shows a housing of an end effector in accordance with an embodiment as disclosed herein.
Figure 4:
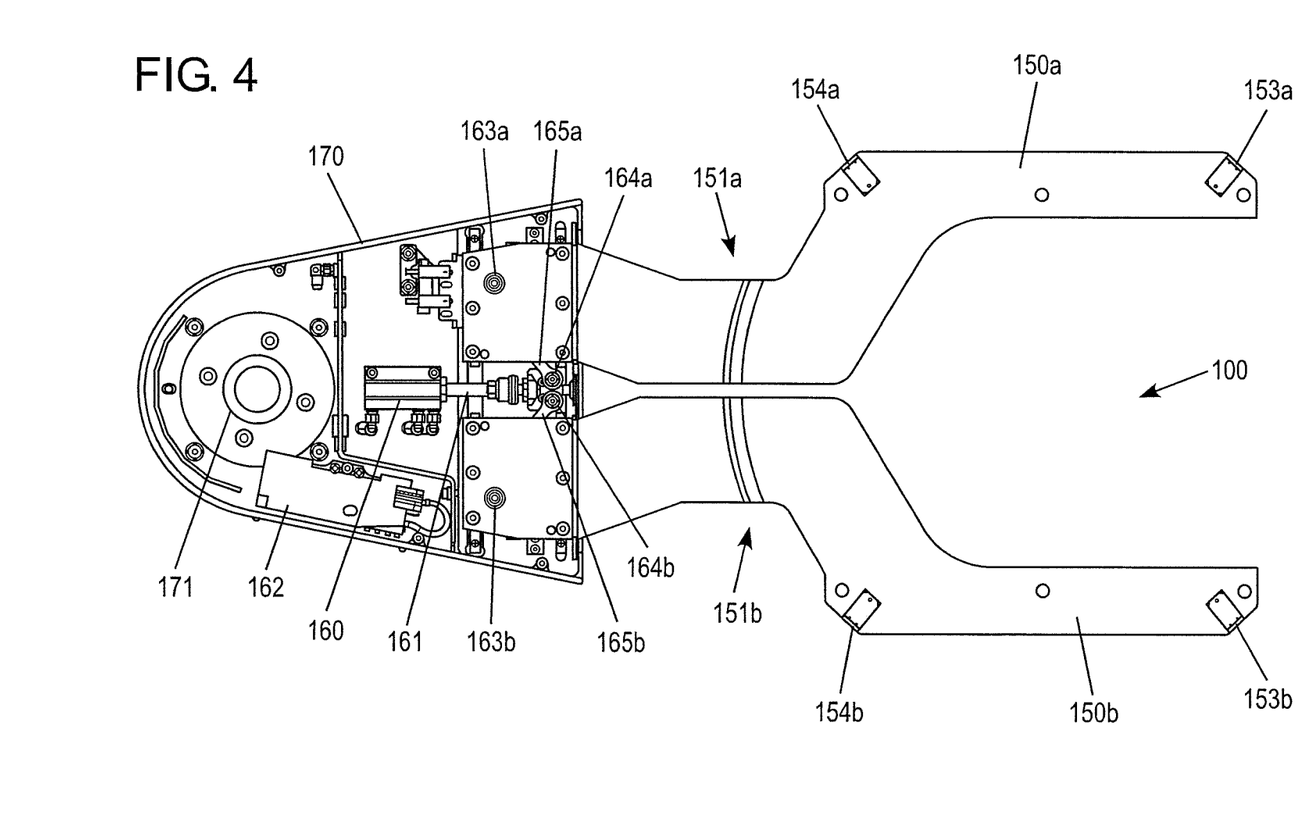
FIG. 4 shows components of a housing of an end effector in accordance with an embodiment as disclosed herein.

FIG. 3 shows a portion of an inside of the housing 170 of an end effector 100. The end effector housing 170 includes a first blade mount 152a, a second blade mount 152b, at least one first mount linear rail 181a, at least one second mount linear rail 181b, and an actuator 160. As shown in FIG. 4, the first blade 150a is coupled to the first blade mount 152a (not visible) at a back end thereof and the second blade 150b is coupled to the second blade mount 152b (not visible) at a back end thereof.

Referring now to FIGS. 3 and 4, the first blade mount 152a is laterally movable on the at least one first mount linear rail 181a, and the second blade mount 152b is laterally movable on the at least one second mount linear rail 181b such that the actuator 160 included in the housing 170 may synchronously move the first and second blade mounts 152a, 152b, and thereby the first and second blades 150a, 150b laterally towards each other and laterally away from each other such that the first and second blades 150a, 150b may hold and release an individual wafer (not shown). Preferably, the first blade mount 152a includes at least one linear guide 180a which is laterally moveable on a respective linear rail of the at least one first mount linear rails 181a and the second blade mount 152b includes at least one linear guide 180b which is laterally movable on a respective linear rail of the at least one second mount linear rails 181b.

Preferably, the first blade mount 152a includes two linear guides 180a which are laterally movable on a respective first linear rail of the at least one first mount linear rails 181a and two linear guides 180a which are laterally movable on a respective second linear rail of the at least one first mount linear rail 181a. Likewise, the second blade mount 152b preferably includes two linear guides 180b which are laterally movable on a respective first linear rail of the at least one second mount linear rails 181b and two linear guides 180b which are laterally movable on a respective second linear rail of the at least one second mount linear rails 181b. Preferably the at least one first mount linear rail 181a and the at least one second mount linear rail 181b are formed of hardened stainless steel and the linear guides 180a and 180b are formed of stainless steel or hardened stainless steel and include stainless steel bearings. By forming the at least one first mount linear rail 181a and the at least one second mount linear rail 181b as described above, particle generation within the housing may be reduced.

The actuator 160 preferably includes a longitudinally movable piston 161 which is coupled to the first blade mount 152a by a first actuator link 165a and to the second blade mount 152b by a second actuator link 165b wherein the longitudinally movable piston 161 is operable to move between a protracted position and a retracted position. In an embodiment, the first actuator link 165a is pivotally coupled to the longitudinally movable piston 161 at a first end thereof by a first link pivot 164a and the first actuator link 165a is pivotally coupled to the first blade mount 152a at a second end thereof by a first mount pivot 163a. The second actuator link 165b is pivotally coupled to the longitudinally movable piston 161 at a first end thereof by a second link pivot 164b and the second actuator link 165b is pivotally coupled to the second blade mount 152b at a second end thereof by a second mount pivot 163b.

In an embodiment, the longitudinally movable piston 161 includes a piston mount 175 at a distal end thereof wherein the piston mount 175 may be coupled to a piston mount guide 183 that is longitudinally movable along at least one piston mount guide rail 182. In this embodiment, the first actuator link 165a is pivotally coupled to the longitudinally movable piston 161 at the piston mount guide 183 and the second actuator link 165b is pivotally coupled to the longitudinally movable piston 161 at the piston mount guide 183. Preferably the first and second link pivots 164a, 164b and the first and second mount pivots 163a, 163b are shielded ball bearing pivots.

In an embodiment, the first blade mount 152a includes a first actuator link recess 174a such that the first actuator link 165a may rotate therein between an upper surface of the first blade mount 152a and a lower surface of the back end of the first blade 150a that is coupled to the first blade mount 152a when the longitudinally movable piston 161 is longitudinally moved and the second blade mount 152b includes a second actuator link recess 174b such that the second actuator link 165b my rotate therein between an upper surface of the second blade mount 152b and a lower surface of a back end of the second blade 150b coupled to the second blade mount 152b when the longitudinally movable piston 161 is longitudinally moved. Thus, moving the longitudinally movable piston 161 of the actuator 160 towards the protracted position causes the first and second blades 150a, 150b to synchronously move laterally towards each other and moving the longitudinally movable piston 161 towards the retracted position causes the first and second blades 150a, 150b to synchronously move laterally away from each other such that an individual wafer may be held and released.

In an embodiment, the actuator 160 may be a pneumatic cylinder. In an alternate embodiment, the longitudinally movable piston 161 of the actuator 160 may be piezo-electrically driven.

In an embodiment, shims (not shown) may be placed between a lower surface of the back end of the first and second blades 150a, 150b and the upper surface of the respective first and second blade mounts 152a, 152b to which the first and second blades 150a, 150b are coupled so as to level and align the first and second blades 150a, 150b on the respective first and second blade mounts 152a, 152b.

The end effector 100 preferably includes a controller 162 which may be integrated with electronics for controlling the operation of embodiments of end effectors 100 as disclosed herein and for performing embodiments of methods as disclosed herein. The electronics may be referred to as the "controller," which may control various components or subparts of the system or sub-systems.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 162, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 162 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level (i.e. a processing module) or as part of a remote computer) that combine to control a process in the chamber.

Without limitation, example semiconductor wafer processing equipment which may receive wafers from an embodiment of an end effector attached to the end of a robot arm as disclosed herein may include processing modules (chambers) including a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing apparatuses or systems that may be associated or used in the fabrication and/or manufacturing of semiconductor wafers.

As noted above, depending on the process step or steps to be performed by the wafer processing apparatus of the wafer processing equipment, the controller 162 thereof might communicate with one or more of other tool circuits or modules, other tool components, cluster tools, other tool interfaces, adjacent tools, neighboring tools, tools located throughout a factory, a main computer, another controller, or tools used in material transfer that bring containers of wafers to and from tool locations and/or load ports in a semiconductor manufacturing factory. Preferably, a non-transitory computer machine-readable medium includes program instructions for control of the end effector 100.

Figure 5A:
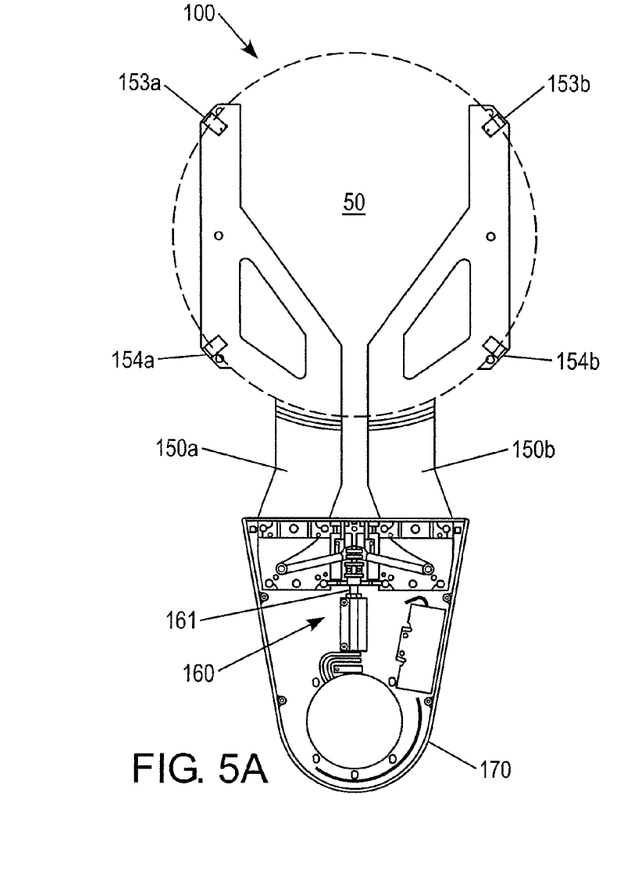
FIGS. 5A-B show an end effector in accordance with an embodiment as disclosed herein.
Figure 5B:
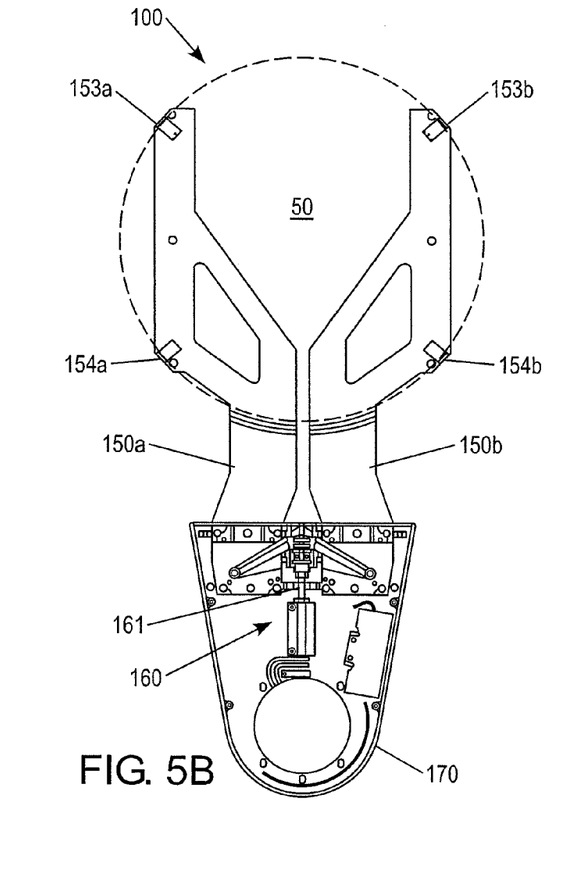

FIGS. 5A and 5B show steps of a method of holding a wafer with an embodiment of an end effector 100 as disclosed herein. As shown in FIG. 5A, to hold a wafer 50 the end effector 100 is positioned with respect to a wafer 50 such that the wafer 50 may be held when the first and second blades 150*a*, 150*b* of the end effector 100 are synchronously moved laterally towards each other. The method includes protracting the longitudinally movable piston 161 such that the first and second blades synchronously move towards each other, and the wafer 50 may thereby be held as shown in FIG. 5B. Preferably, the first and second blades 150*a*, 150*b* and the spacing between the front and back wafer pads 153*a*, 153*b*, 154*a*, 154*b* thereof is selected such that the end effector 100 may hold a wafer having a diameter of about 300 mm or a diameter of about 450 mm. In a preferred embodiment, the method includes gripping an edge or an outer periphery of the wafer 50 with respective gripping surfaces of the front and back wafer pads 153*a*, 153*b* 154*a*, 154*b* of the end effector 100 wherein the gripping surfaces of the front and back wafer pads 153*a*, 153*b* 154*a*, 154*b* are shaped to properly align the wafer 50 over the first and second blades 150*a*, 150*b* of the end effector 100.

The method can further include transferring the wafer 50 from a first location in a first module of semiconductor wafer processing equipment to a second location in the first module of semiconductor wafer processing equipment or to a first location in a second module of semiconductor wafer processing equipment, and releasing the wafer 50 at the second location in the first module or the first location in the second module by retracting the longitudinally movable piston such that the first and second blades 150*a*, 150*b* synchronously move away from each other.

To release the wafer 50, the end effector 100 may be positioned above a wafer support surface of a wafer support, such as an electrostatic chuck or heated pedestal, at the second location in the first module or the first location in the second module, and lift pins included in the wafer support may be raised. The wafer may then be released onto the raised lift pins, and the lift pins may be lowered such that the wafer is supported on the support surface of the wafer support. Alternatively, the lift pins may be raised before the wafer is positioned thereabove. Additionally, the end effector 100 may be operable to remove the wafer 50 from a front opening unified pod (FOUP) such that the wafer 50 may be subsequently processed or the end effector 100 may be operable to place a processed wafer in a FOUP.

Figure 6:
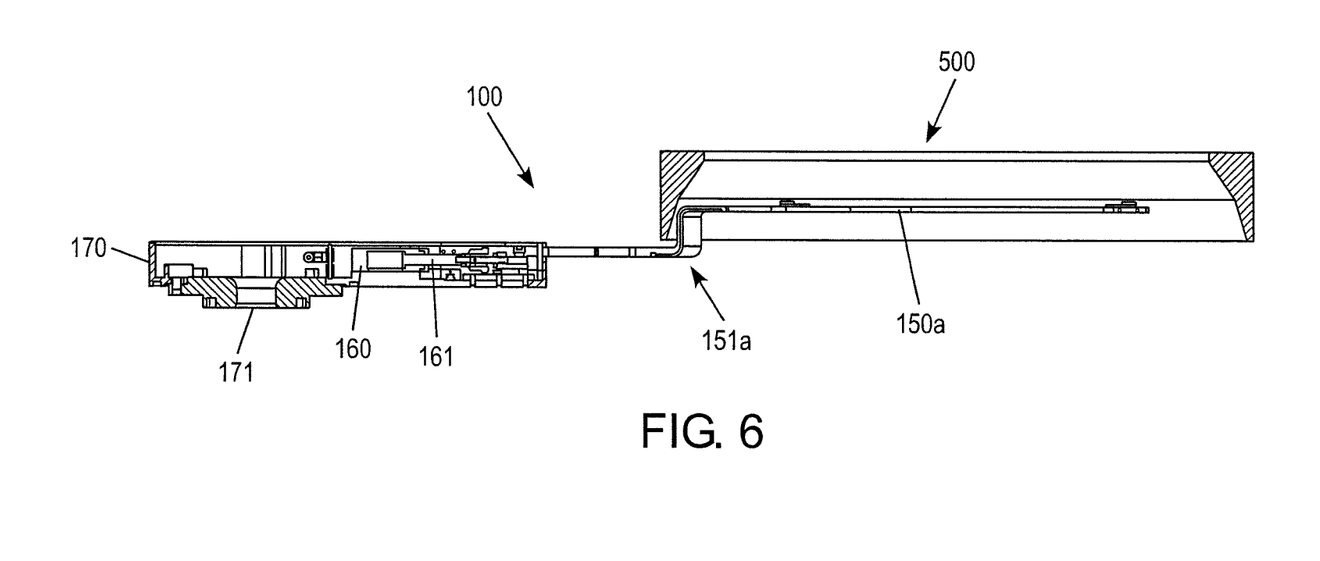
FIG. 6 shows an end effector in accordance with an embodiment as disclosed herein.

In a further embodiment, the module of the wafer processing equipment may include a recessed chuck 500 as shown in FIG. 6. For example, the recessed chuck 500 as shown in FIG. 6 may be a recessed rotary chuck such as that disclosed in commonly assigned U.S. Patent Application Publication 2013/0101372 which is hereby incorporated herein by reference in its entirety. To transfer a wafer 50 to the recessed chuck 500, the wafer 50 is held by an end effector 100 that is moved and positioned adjacent the recessed chuck 500. The first blade step 151*a* of the first blade 150*a* and the second blade step (not shown) of the second blade (not shown) allow the wafer 50 to be positioned within or beneath the recessed chuck 500 such that the first and second blades 150*a*, 150*b* of the end effector 100 do not contact the recessed chuck 500 or a housing of the wafer processing equipment including the recessed chuck 500. After the wafer 50 is positioned within the recessed chuck 500, pins (not shown) of the recessed chuck are moved radially inward to clamp an edge of the wafer 50, wherein the wafer 50 may then be released by the end effector 100 such that the wafer 50 may be processed. To remove the wafer 50, the end effector 100 may be positioned below the wafer wherein the first and second blades 150*a*, 150*b* are synchronously moved together to hold the wafer 50. The pins of the recessed chuck 500 are then moved radially outward such that the edge of the wafer 50 is no longer supported by the pins and the wafer 50 may be removed from the recessed chuck 500 by the end effector 100.

Embodiments disclosed herein have been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way.

What is claimed is:

1. An end effector of a robot arm of a wafer transfer system operable to hold and release individual wafers such that the robot arm can transfer a held wafer during semiconductor wafer processing, the end effector comprising:

an end effector housing, the end effector housing including a first blade mount coupled to a first blade, a second blade mount coupled to a second blade, a first pair of mount linear rails, a second pair of mount linear rails, a pair of linear guides on the first blade mount movable along the first pair of mount linear rails and a second pair of linear guides on the second blade mount movable along the second pair of mount linear rails and an actuator wherein the first blade mount is laterally movable on the first pair of mount linear rails and the second blade mount is laterally movable on the second pair of mount linear rails such that the actuator included in the housing can synchronously move the first and second blades laterally towards each other and laterally away from each other such that the first and second blades can hold and release an individual wafer;

the actuator including a longitudinally movable piston which is coupled to the first blade mount by a first actuator link and to the second blade mount by a second actuator link wherein the longitudinally movable piston is operable to move between a protracted position and a retracted position;

wherein the first actuator link is pivotally coupled to the longitudinally movable piston at a first end thereof by a first link pivot and the first actuator link is pivotally coupled to the first blade mount at a second end thereof by a first mount pivot, and the second actuator link is pivotally coupled to the longitudinally movable piston at a first end thereof by a second link pivot and the second actuator link is pivotally coupled to the second blade mount at a second end thereof by a second mount pivot;

the first blade mount including a first actuator link recess such that the first actuator link is rotatable about one end therein between an upper surface of the first blade mount and a lower surface of a back end of the first blade when the longitudinally movable piston is longitudinally moved and the second blade mount including a second actuator link recess such that the second actuator link is rotatable about one end therein between an upper surface of the second blade mount and a lower surface of a back end of the second blade when the longitudinally movable piston is longitudinally moved;

wherein moving the longitudinally movable piston towards the protracted position causes the first and second blades to synchronously move laterally towards each other and moving the longitudinally movable piston towards the retracted position causes the first and second blades to synchronously move laterally away from each other.

2. The end effector of claim 1, wherein the longitudinally movable piston includes a piston mount at a distal end thereof coupled to a piston mount guide wherein the piston mount guide is longitudinally movable along at least one piston mount guide rail.

3. The end effector of claim 2, wherein the first actuator link is pivotally coupled to the longitudinally movable piston at the piston mount and the second actuator link is pivotally coupled to the longitudinally movable piston at the piston mount.

4. The end effector of claim 1, wherein the first and second link pivots and the first and second mount pivots are shielded ball bearing pivots.

5. The end effector of claim 1, wherein the actuator is a pneumatic cylinder or piezo-electrically driven.

6. The end effector of claim 1, wherein the first blade includes a first blade step along a length thereof and the second blade includes a second blade step along a length thereof such that a wafer can be positioned within a recessed chuck without the first or second blades contacting the chuck or a housing of the wafer processing equipment including the recessed chuck.

7. The end effector of claim 1, wherein a first blade front wafer pad and a first blade back wafer pad extend from the first blade and a second blade front wafer pad and a second blade back wafer pad extend from the second blade wherein the front and back wafer pads of the first blade and the second blade are adapted to hold an individual wafer such that the wafer does not contact the first blade or the second blade.

8. The end effector of claim 7, wherein:
the first blade front wafer pad, the first blade back wafer pad, the second blade front wafer pad, and the second blade back wafer pad are made of polyether ether ketone.

9. The end effector of claim 1, wherein the first blade mount includes at least four linear guides that are laterally moveable on the first pair of linear rails and the second blade mount includes at least four linear guides which are laterally moveable on the second pair of linear rails.

10. The end effector of claim 1, wherein the end effector is rotatably mounted on an end of a robot arm.

11. The end effector of claim 1, further comprising a controller configured to control processes performed by the end effector.

12. A wafer handling system including a robot arm operable to transfer individual wafers between semiconductor wafer processing equipment, the robot arm including the end effector of claim 1 rotatably mounted on an end thereof.

13. The wafer transfer system of claim 12, wherein the wafer transfer system is an equipment front end module (EFEM), a vacuum wafer transfer module, or an atmospheric wafer transfer module.

14. A method of holding a wafer with the end effector of claim 1, the method comprising:

positioning the end effector with respect to a wafer such that the wafer can be held when the first and second blades of the end effector are synchronously moved laterally towards each other;
protracting the longitudinally movable piston such that the first and second blades synchronously move towards each other and grip an outer periphery of the wafer.

15. The method of claim 14, further comprising gripping an edge of the wafer with a gripping surface of wafer pads disposed on the first and second blades of the end effector.

16. The method of claim 14, further comprising retracting the longitudinally movable piston such that the first and second blades move synchronously away from each other so as to release the wafer.

17. A method of transferring a wafer between semiconductor wafer processing equipment using the wafer handling system of claim 12, the method comprising:
positioning the end effector with respect to a wafer such that the wafer can be held when the first and second blades of the end effector are synchronously moved laterally towards each other;
protracting the longitudinally movable piston such that the first and second blades synchronously move towards each other and grip an outer periphery of the wafer;
transferring the wafer from a first location in a first module of semiconductor wafer processing equipment to a second location in the first module of semiconductor wafer processing equipment or to a first location in a second module of semiconductor wafer processing equipment; and
releasing the wafer at the second location in the first module or the first location in the second module by retracting the longitudinally movable piston such that the first and second blades synchronously move away from each other.

18. The method of claim 17, further comprising removing the wafer from a front opening unified pod (FOUP) such that the wafer can be subsequently processed or placing a processed wafer into a FOUP.

19. The end effector of claim 7, wherein the first blade front wafer pad, the first blade back wafer pad, the second blade front wafer pad, and the second blade back wafer pad each include a support surface and a gripping surface wherein the gripping surfaces are shaped to automatically center the wafer over the first and second blades of the end effector when the wafer is held by the end effector.

20. The end effector of claim 1, further comprising a non-transitory computer machine-readable medium comprising program instructions for control of the end effector.

* * * * *